(12) United States Patent
Ito et al.

(10) Patent No.: US 10,435,813 B2
(45) Date of Patent: Oct. 8, 2019

(54) EPITAXIAL GROWTH METHOD FOR SILICON CARBIDE

(71) Applicant: SHOWA DENKO K.K., Tokyo (JP)

(72) Inventors: Wataru Ito, Tokyo (JP); Takashi Aigo, Tokyo (JP); Tatsuo Fujimoto, Tokyo (JP)

(73) Assignee: SHOWA DENKO K.K., Tokyo (JP)

( * ) Notice: Subject to any disclaimer, the term of this patent is extended or adjusted under 35 U.S.C. 154(b) by 0 days.

(21) Appl. No.: 15/548,217

(22) PCT Filed: Feb. 12, 2016

(86) PCT No.: PCT/JP2016/054179
§ 371 (c)(1),
(2) Date: Aug. 2, 2017

(87) PCT Pub. No.: WO2016/129685
PCT Pub. Date: Aug. 18, 2016

(65) Prior Publication Data
US 2018/0266012 A1    Sep. 20, 2018

(30) Foreign Application Priority Data
Feb. 12, 2015    (JP) .................................. 2015-025642

(51) Int. Cl.
*C30B 25/20* (2006.01)
*C30B 25/14* (2006.01)
(Continued)

(52) U.S. Cl.
CPC .......... *C30B 25/20* (2013.01); *C23C 16/325* (2013.01); *C23C 16/42* (2013.01); *C23C 16/452* (2013.01);
(Continued)

(58) Field of Classification Search
CPC combination set(s) only.
See application file for complete search history.

(56) References Cited

U.S. PATENT DOCUMENTS 4,830,890 A * 5/1989 Kanai ..................... C23C 16/24
                                                      136/258
6,653,212 B1 * 11/2003 Yamanaka .......... C23C 16/0236
                                                      118/723 VE
(Continued)

FOREIGN PATENT DOCUMENTS

CN    102099505 A    6/2011
CN    106191811 A    12/2016
(Continued)

OTHER PUBLICATIONS

Machine English translation of JP 2000-223421 (Aug. 11, 2000).
(Continued)

*Primary Examiner* — Erin F Bergner
(74) *Attorney, Agent, or Firm* — Birch, Stewart, Kolasch & Birch, LLP (57) ABSTRACT

The present invention provides a method of epitaxial growth of an SiC thin film by the thermal CVD process wherein it is possible to improve the in-plane uniformity of the doping density and possible to grow an SiC thin film by a uniform thickness. This method is an epitaxial growth method for silicon carbide characterized by comprising adjusting a ratio of the hydrocarbon gas and silicon feedstock gas so as to become, by C/Si ratio, 0.5 to 1.5 in range, making the hydrocarbon gas contact a hydrocarbon decomposition catalyst heated to 1000° C. to 1200° C. so as to make at least part of the hydrocarbon gas break down into carbon and hydrogen, and supplying carbon contained in the hydrocarbon gas and silicon contained in the silicon feedstock gas to the silicon carbide single crystal substrate.

7 Claims, 4 Drawing Sheets

(51) Int. Cl.
*C23C 16/42* (2006.01)
*C23C 16/452* (2006.01)
*C30B 29/36* (2006.01)
*H01L 21/205* (2006.01)
*C30B 25/16* (2006.01)
*C23C 16/32* (2006.01)
*H01L 21/02* (2006.01)

(52) U.S. Cl.
CPC ............ *C30B 25/14* (2013.01); *C30B 25/165* (2013.01); *C30B 29/36* (2013.01); *H01L 21/0262* (2013.01); *H01L 21/02529* (2013.01); *H01L 21/02634* (2013.01); *H01L 21/205* (2013.01)

(56) References Cited

U.S. PATENT DOCUMENTS

| | | |
|---|---|---|
| 2008/0032880 A1 | 2/2008 | Maruyama et al. |
| 2011/0135843 A1 | 6/2011 | Niira et al. |
| 2016/0348239 A1 | 12/2016 | Furumura et al. |

FOREIGN PATENT DOCUMENTS

| | | |
|---|---|---|
| JP | 63-040314 A | 2/1988 |
| JP | 2000-223421 A | 8/2000 |
| JP | 2001-044124 A | 2/2001 |
| JP | 2003-155567 A | 5/2003 |
| JP | 2004-091821 A | 3/2004 |
| JP | 2009-287064 A | 12/2009 |
| JP | 2010-267702 A | 11/2010 |
| WO | WO 2005/116307 A1 | 12/2005 |

OTHER PUBLICATIONS

Machine English translation of JP 2001-044124 (Feb. 16, 2001).
Machine English translation of JP 2003-155567 (May 30, 2003).
Machine English translation of JP 2004-091821 (Mar. 25, 2004).
Machine English translation of JP 2009-287064 (Dec. 10, 2009).
Machine English translation of JP 2010-267702 (Nov. 25, 2010).
Machine English translation of JP 63-040314 (Feb. 20, 1988).
Masumoto et al., "Growth of silicon carbide epitaxial layers on 150-mm-diameter wafers using a horizontal hot-wall chemical vapor deposition," Journal of Crystal Growth (2013), vol. 381, pp. 139-143.
Tsuchida et al., "Low-pressure fast growth and characterization of 4H—SiC epilayers," Materials Science Forum (Apr. 29, 2010), vols. 645-648, pp. 77-82.
International Search Report (PCT/ISA/210) issued in PCT/JP2016/054179, dated Mar. 8, 2016.
Written Opinion (PCT/ISA/237) issued in PCT/JP2016/054179, dated Mar. 8, 2016.
Chinese Office Action and Search Report, dated May 8, 2019, for Chinese Application No. 201680003693.7, along with an English translation of the Chinese Office Action.
Li, "Preparation of Nanometer β-SiC Thin Films by Catalytic CVD at Low Temperature and Study on Their Properties," Dissertation from Chinese Excellent Doctoral Dissertation Full-text Database (Master) Engineering Science and Technology II, No. 2, Dec. 15, 2002, 3 pages.

\* cited by examiner

EPITAXIAL GROWTH METHOD FOR SILICON CARBIDE

TECHNICAL FIELD

This invention relates to an epitaxial growth method for silicon carbide for growing silicon carbide thin film on a silicon carbide single crystal substrate.

BACKGROUND ART

Silicon carbide (below, referred to as "SiC") is excellent in heat resistance and mechanical strength and is stable physically and chemically, so is drawing attention as an environmentally resistant semiconductor material. Further, in recent years, demand has been rising for epitaxial SiC wafers as substrates for high frequency high voltage resistant electronic devices etc.

When using SiC single crystal substrates (below, referred to as "SiC substrates") to fabricate power devices or high frequency devices etc., usually epitaxial SiC wafers comprised of SiC substrates on which SiC single crystal thin films are epitaxially grown by the thermal CVD process (thermal chemical vapor deposition process) are produced. The reason for further forming an SiC epitaxially grown film on an SiC substrate is to build in devices using layers controlled in doping density. Therefore, if the doping density is insufficiently controlled, the problem is caused that the device characteristics will not be stable. The general practice is to use nitrogen as the SiC doping gas, but nitrogen enters the sites of C in the SiC, so it is known that the smaller the C/Si ratio in the mixed feedstock gases, the easier it is for nitrogen to be taken into the crystal structure. Such an effect is called "site competition".

If using the thermal CVD process, in general, the method is employed of placing the SiC substrate on a holder in a growth chamber, making the holder rotate while supplying for example feedstock gases comprised of silane gas or chlorosilane gas or other silicon feedstock gas and propane or methane or other hydrocarbon gas mixed together (below, referred to as "mixed feedstock gases") together with hydrogen or another carrier gas directly over the SiC substrate and thereby epitaxially growing an SiC single crystal thin film (for example, see NPLT 1). At that time, in order to place the SiC substrate on the holder, the general practice is to form the surface of the holder in advance with a recess corresponding to the thickness of the SiC substrate, place the SiC substrate in that recess so that the SiC substrate is carried in a fixed manner, then supply the feedstock gases as explained above from the side of the SiC substrate in a way that blows the feedstock substantially horizontal with respect to the SiC substrate.

When using such a configuration to epitaxially grow an SiC single crystal thin film, in general, the C/Si ratio of the gases differs between the upstream side and downstream side of the flow of gases in the growth chamber. The reason is that if supplying mixed feedstock gases while making the C/Si ratio smaller than 1 so that nitrogen is easily taken into the crystal structure, the carbon and silicon will be consumed in a 1:1 ratio and the gases will deposit as SiC on the SiC substrate, so the relative amount of the carbon in the mixed feedstock gases will fall the further downstream in the flow, and the C/Si ratio will become smaller the further downstream in the flow. Since carbon and silicon are consumed in a 1:1 ratio, if supplying mixed feedstock gases while making the C/Si ratio larger than 1, the C/Si in the mixed feedstock gases will become larger the further downstream in the flow.

In view of this principle, if causing epitaxial growth while making the C/Si ratio in the mixed feedstock gases a ratio of 1, the C/Si ratios at the upstream and downstream sides of the flow of gas inside the growth chamber will not change. However, the C/Si ratio of mixed feedstock gases is an important parameter in the epitaxial growth conditions. To reduce the defect density, reduce bunching, improve in-plane uniformity, and otherwise improve the quality as sought for epitaxial SiC wafers, the pressure, growth temperature, etc. are considered as well and in general a ratio of other than 1 is selected.

For example, PLT 1 discloses a process for production of a silicon carbide single crystal wafer including a step of making a silicon source gas and a carbon source gas react to epitaxially grow an α-type silicon carbide single crystal on a wafer. PLT 1 discloses that the ratio of supply (C/Si) of carbon (C) in the carbon source gas and silicon (Si) in the silicon source gas is preferably 0.5 to 1.4 from the viewpoint of excellent epitaxial growth and the viewpoint of prevention of macrotriangular pit defects.

To deal with the above such problem of the C/Si ratio not becoming uniform, it is in principle possible to make the holder of the epitaxial system using the thermal CVD process itself rotate so as to cancel out changes in the environment between the upstream side and downstream side of the flow of gas. However, in actuality, it is broadly known that if performing epitaxial growth, the doping density at the holder in the planar direction is not sufficiently leveled (for example, see NPLT 2). This suggests that a different situation is occurring between upstream and downstream of the flow of gas other than changes in the C/Si ratio in the mixed feedstock gases.

CITATION LIST

Patent Literature

PLT 1: WO2005/116307A pamphlet
PLT 2: Japanese Patent Publication No. 63-40314A
PLT 3: Japanese Patent Publication No. 2000-223421A
PLT 4: Japanese Patent Publication No. 2003-155567A

Nonpatent Literature

NPLT 1: Materials Science Forum, Vols. 45-648 (2010), pp. 77-82
NPLT 2: Journal of Crystal Growth, Vol. 381 (2013), pp. 139-143

SUMMARY OF INVENTION

Technical Problem

The present invention was made so as to solve this problem, that is, the problem that despite making the holder of the epitaxial system using the thermal CVD process rotate, the in-plane uniformity of the doping density at the holder is not leveled out and therefore the in-plane uniformity of the doping density of the SiC wafer placed on top of that is impaired.

Solution to Problem

To solve the above problem, the inventors engaged in intensive studies and as a result found that the reason why the doping density does not become uniform in the planar direction is not the difference in the C/Si ratio in the mixed feedstock gases between upstream and downstream in the flow of gases, but is other causes.

That is, in the conventional epitaxial growth method utilizing the thermal CVD process, the C/Si ratio assumed the hydrocarbon gas and silicon feedstock gas completely decomposed. The hydrocarbon gas and silicon feedstock gas were introduced in a 1500 to 1800° C. atmosphere and the SiC was made to deposit while controlling the C/Si ratio as a parameter.

However, upstream of the flow of gases in the growth chamber (below, referred to as "upstream in the gas flow"), the gases are still not sufficiently heated, so the hydrocarbon gas is not sufficiently decomposed. As a result, upstream in the gas flow in the growth chamber, the hydrocarbon gas and silicon feedstock gas reacted so the C/Si ratio seemingly becomes smaller than the design value (stoichiometric ratio), so the SiC wafer was easily doped. This is believed to be the cause for the doping density not being leveled out even if the holder rotates.

Therefore, the inventors came to the conclusion that if breaking down the hydrocarbon gas in advance in the region of gas flow not sufficiently heated, it would be possible to make the C/Si ratio of the hydrocarbon gas and silicon feedstock gas deemed to seemingly be supplied in that gas region (below, referred to as the "effective C/Si ratio") approach the ratio of the hydrocarbon gas and silicon feedstock gas supplied (that is, also referred to as the "design value of the C/Si ratio" or the "stoichiometric ratio of the C/Si ratio"). Further, as the method for breaking down hydrocarbon gas into carbon and hydrogen, the inventors learned that using a catalyst was effective.

PLT 2 discloses a process for production of a thin film by the catalyst CVD process. The process of production disclosed in PLT 2 is characterized by making at least part of the feedstock gases, including silicon difluoride $SiF_2$ gas or other silicon fluoride gases, catalytically react or react to thermally decompose so as to generate deposition species or their precursors. PLT 2 discloses amorphous silicon carbide or a microcrystalline or polycrystalline semiconductor is formed when including $C_2H_4$ gas or other hydrocarbon gas in that feedstock gases.

Further, PLT 3 discloses a film growing method comprising bringing feedstock gases containing silicon hydride or derivative thereof into contact with a heated catalyst member and guiding the thus generated deposition species or precursor thereof on to a substrate to make a predetermined film grow by vapor phase deposition.

Further, PLT 4 discloses to introduce into a reaction chamber having a heating filament comprised of W, Ta, Ti, Zr, Rh, Pd, Pt, or another transition metal a feedstock gas comprised of a vapor of an alkyl silicon compound and to heat that heating filament so as to form a film of a composition including Si and C on a substrate arranged in that reaction chamber.

However, PLTs 2 to 4 do not disclose that an SiC single crystal thin film can be formed. Further, the film including the Si and C disclosed in PLT 4 is a mixed film including Si and C not a crystalline SiC compound or amorphous SiC in any ratio. Further, PLTs 2 to 4 do not disclose or suggest how the C/Si ratio of the feedstock gases changes by virtue of the catalytic reaction or thermal decomposition reaction of the feedstock gases.

Unlike a hydrocarbon gas, silane, disilane, trichlorosilane, dichlorosilane, silicon tetrachloride, and other silicon feedstock gases have faster decomposition speeds compared with a hydrocarbon gas, so it is not necessarily required to rely on the assistance of a catalyst. Therefore, the variation is similarly reduced both if only a hydrocarbon gas contacts the catalyst and if a silicon feedstock gas and hydrocarbon gas are mixed together in advance and then contact the catalyst.

Therefore, an object of the present invention is to provide a method of epitaxial growth of an SiC thin film by the thermal CVD process wherein it is possible to improve the in-plane uniformity of the doping density and possible to grow an SiC thin film by a uniform thickness. The gist of the present invention is as follows:

(1) An epitaxial growth method for silicon carbide making a hydrocarbon gas and silicon feedstock gas react by a thermal CVD process to thereby form a silicon carbide thin film on a silicon carbide single crystal substrate, the epitaxial growth method for silicon carbide comprising adjusting a ratio of the hydrocarbon gas and silicon feedstock gas so as to become, by C/Si ratio, 0.5 to 1.5 in range, making the hydrocarbon gas contact a hydrocarbon decomposition catalyst heated to 1000° C. to 1200° C. so as to make at least part of the hydrocarbon gas break down into carbon and hydrogen, and making carbon contained in the hydrocarbon gas and silicon contained in the silicon feedstock gas react at 1500° C. to less than 1800° C. in temperature on the silicon carbide single crystal substrate and form a silicon carbide thin film.

(2) The epitaxial growth method for silicon carbide according to (1), wherein the ratio of the amount of the hydrocarbon gas made to contact the hydrocarbon decomposition catalyst and decompose in the total amount is 50% or more.

(3) The epitaxial growth method for silicon carbide according to (1) or (2), wherein the hydrocarbon decomposition catalyst comprises at least one type of metal selected from ruthenium, rhodium, palladium, platinum, copper, titanium, zirconium, and hafnium or an alloy comprised of at least two types of elements of the group of metal elements.

(4) The epitaxial growth method for silicon carbide according to any one of (1) to (3), wherein the hydrocarbon decomposition catalyst is provided with a sheet-shaped contact surface contacting the hydrocarbon gas.

(5) The epitaxial growth method for silicon carbide according to any one of (1) to (4), wherein a thickness of the silicon carbide thin film formed on the silicon carbide single crystal substrate is 3 µm to 50 µm.

(6) The epitaxial growth method for silicon carbide according to any one of (1) to (5), wherein the hydrocarbon gas is one or more types of gas selected from a group comprising methane, ethane, propane, butane, ethylene, and acetylene.

(7) The epitaxial growth method for silicon carbide according to any one of (1) to (6), wherein the silicon feedstock gas is one or more types of gas selected from a group comprising silane, disilane, trichlorosilane, dichlorosilane, and silicon tetrachloride.

(8) The epitaxial growth method for silicon carbide according to any one of (1) to (7), wherein the hydrocarbon gas is made to contact the hydrocarbon decomposition catalyst in a state of mixed feedstock gases comprising the hydrocarbon gas and the silicon feedstock gas mixed together.

Advantageous Effects of Invention

According to the present invention, it is possible to make the effective C/Si ratio approach the designed stoichiometric ratio even in a region of gas flow not sufficiently heated in a growth chamber, so it is possible to greatly improve the in-plane uniformity of the doping density over the entire holder of an epitaxial system using the thermal CVD process. For this reason, no matter how an SiC wafer arranged on the holder is arranged, the SiC wafer is improved in in-plane uniformity of the doping density. Further, the variation in doping density among SiC wafers in the case of placing a plurality of SiC wafers on the holder can be reduced.

DESCRIPTION OF EMBODIMENTS

Figure 1:
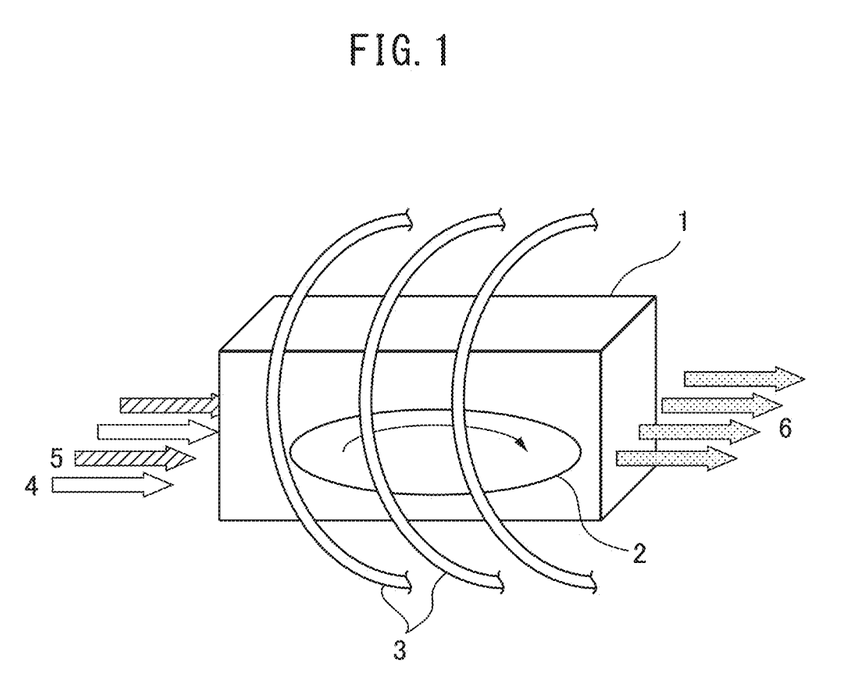
FIG. 1 is a schematic view of an epitaxial system in which the present invention is suitably used.

Below, the present invention will be explained in detail. FIG. 1 is a schematic view of an epitaxial system in which the present invention is suitably used. This schematically shows a structure similar to that generally used in the thermal CVD process in the past. This epitaxial system is provided with a holder 2 inside a growth chamber of a reaction vessel 1. At the outside of the reaction vessel 1, a heating use induction coil 3 is attached so as to surround the reaction vessel 1. Further, from one side of the reaction vessel 1, a hydrocarbon gas 4 and silicon feedstock gas 5 are respectively supplied together with hydrogen gas or another carrier gas from the one side so as to become substantially horizontal with respect to the holder 2. From the other side, the gases after being used for epitaxial growth are discharged as exhaust gases 6. Among these, the holder 2 is a structural member having heat resistance and comprising a carbon member coated with SiC, and the holder 2 is formed with recesses in topmost part thereof. SiC wafers are placed on the topmost part. Further, this holder 2 is provided with a rotating mechanism whereby it becomes possible to reduce unevenness of the wafer in the planar direction and suppress variations among SiC wafers when simultaneously treating a plurality of SiC wafers.

Improvement of the uniformity of doping density of the holder as a whole leads to reduction of the unevenness of doping density of the SiC wafer surfaces and suppression of variation among SiC wafers. The reason is that no matter how the SiC wafers are arranged, the uniformity of doping density on the holder is reflected in the uniformity of doping density of the SiC wafer surfaces and the suppression of variation of doping density among SiC wafers.

Figure 2:
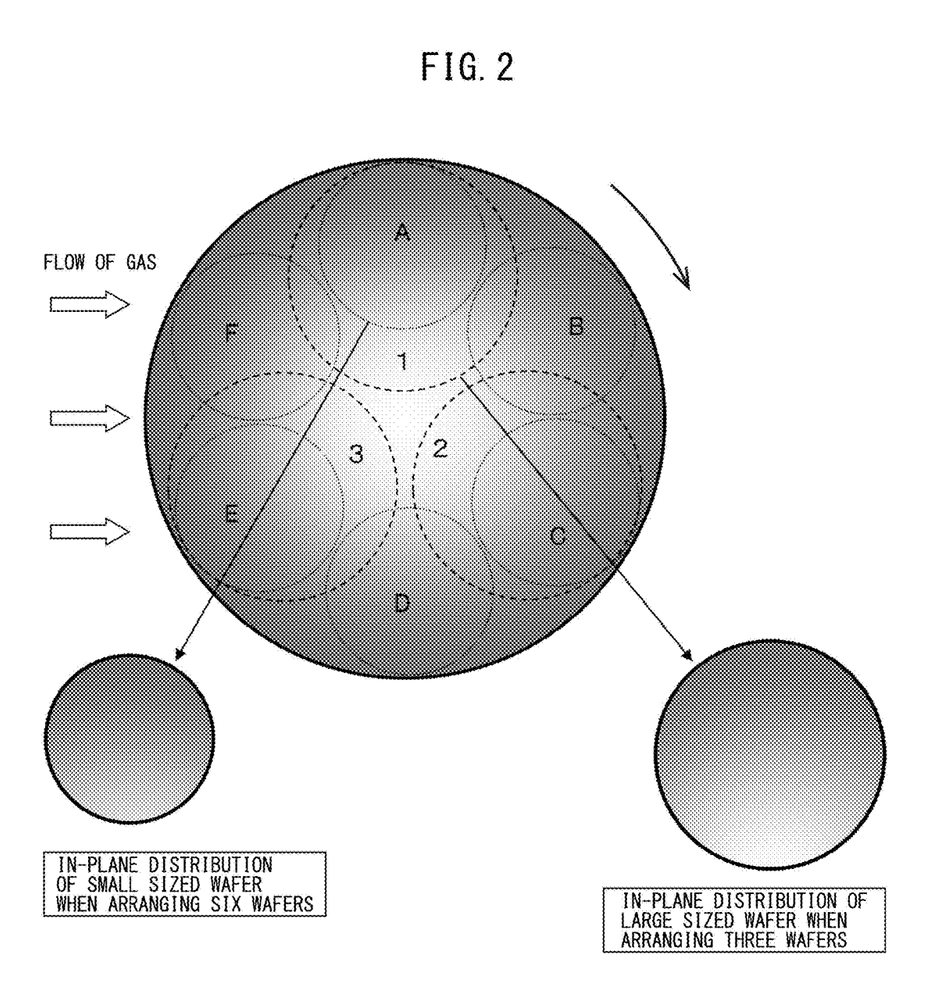
FIG. 2 is a view explaining visually how the in-plane uniformity of doping density of a holder is reflected in the in-plane uniformity of an SiC wafer placed thereon.

FIG. 2 is a view explaining visually how the in-plane uniformity of doping density on a plane of a holder is reflected in the in-plane uniformity of an SiC wafer placed thereon. That is, as shown in FIG. 2, even if the holder 2 is provided with a rotating mechanism and the SiC wafers are made to rotate in the horizontal plane, if the hydrocarbon gas supplied to the inside of the growth chamber is insufficiently broken down, the C/Si ratio becomes smaller upstream in the gas flow and the peripheral side of the holder 2 ends up becoming easier to be doped compared with the center side.

For this reason, a catalyst is used to contact and break down at least part of the hydrocarbon gas in advance so carbon-containing gas containing decomposed gas of the hydrocarbon gas and not yet decomposed hydrocarbon gas is supplied to the inside of the growth chamber. The decomposed gas of the hydrocarbon gas is believed to be a mixed gas comprising methyl groups ($CH_3$) or methylidene groups ($CH_2$) or methylidine groups (CH) and other monocarbon hydrocarbon gases and/or carbon atoms. By breaking down at least part of the hydrocarbon gas in this way, uniformity of the doping density of the holder as a whole is secured and uniformity of the doping density of both the SiC wafer surfaces and among SiC wafers is simultaneously improved. The uniformity of thickness of the SiC thin films can also be similarly improved. Note that the degrees of shading in the holder 2 in FIG. 2 schematically show the magnitude of the doping density or film thickness. Further, in FIG. 2, the example where six SiC wafers are placed (A to F) and the example where three are placed (1 to 3) are shown, but one may also be placed or other numbers placed of course. Further, the object of the present invention is achieved no matter what the method of placement of the SiC wafers on the holder 2.

As explained above, the cause of uniformity of doping density of the holder as a whole being impaired is believed to be the fact that the hydrocarbon gas is not sufficiently broken down upstream in the flow of feedstock gas containing the carbon ingredient of the epitaxial SiC. Here, in the case of using propane ($C_3H_8$) as the feedstock hydrocarbon gas of the carbon ingredient, using silane ($SiH_4$) as the silicon feedstock gas, and making the C/Si ratio 0.9 to form the film, since propane gas has three carbon atoms, it may be considered to supply the silane gas and the propane gas in a ratio of 0.3/1. However, at this time, if the propane gas fully breaks down, since the amount of C becomes 3 times, the C/Si becomes 0.9 (=0.3×3/1). However, if the hydrocarbon gas is not sufficiently broken down at the upstream side, the C/Si ratio falls below 0.9. In this way, even if making the parameter of the C/Si ratio 0.9, there would be parts which are not yet broken down at the upstream side, so the ratio would become less than this.

In this regard, the general practice is to use nitrogen gas as the doping gas when obtaining an epitaxial SiC wafer, but as explained above, nitrogen (N) enters the sites of C of the SiC, so the smaller the C/Si ratio in the mixed feedstock gases in which the hydrocarbon gas and silicon feedstock gas are mixed together, the easier it is for the nitrogen to enter the crystal structure. Therefore, when the hydrocarbon gas is not sufficiently broken down upstream, the effective C/Si ratio at the upstream side becomes smaller. As a result, the further upstream, the more the nitrogen is taken in and the nitrogen concentration rises. This tendency becomes remarkable at the doping density at the upstream side. Since the doping density becomes extremely high at the upstream side, even if the holder rotates, the doping density becomes high at the holder circumference and a concentric distribution where the density becomes lower the further toward the center ends up being formed.

As one method to solve this problem, for example, it may be considered effective to make the temperature at the feed position of the hydrocarbon gas in the reaction vessel a sufficiently high temperature and make the hydrocarbon gas sufficiently break down from the start. Therefore, the inventors actually did this by making the member supplying the mixed feedstock gas a carbon member with a high heat resistance and raising the temperature of the mixed feedstock gases to promote decomposition. They learned that there was the problem that the temperature at the position supplying the mixed feedstock gases led to the buildup of silicon carbide, the silicon carbide progressively built up on the supply member, and the feed port of the mixed feedstock gases became clogged.

Therefore, the inventors studied the possibility of using a catalyst as a method of breaking down hydrocarbon gas without making the mixed feedstock gases high in temperature. Usual catalysts are used in a powdered state with a large specific surface area to increase the reaction sites, but powder cannot be brought into an epitaxial system, so in the conventional technologies no one thought of using a catalyst. The present inventors discovered that even if the specific surface area is small, in the 1000° C. or higher temperature region, an effect as a catalyst contacting and breaking down a hydrocarbon gas is obtained. Further, if controlling the temperature so as to become right before the temperature where SiC starts to build up, for example, 1200° C. or less, the above-mentioned problem of buildup of silicon carbide at the gas feed port does not arise.

All of the supplied hydrocarbon gas is most preferably broken down into carbon (C) and hydrogen (H), but even if the decomposition of the hydrocarbon gas is partial, it is believed there is an advantageous effect in the point of improving the uniformity of the doping density etc. However, in order to make the effective C/Si ratio in the region of gas flow which is not sufficiently heated a level deemed to be the design value of the C/Si ratio, the ratio of the supplied hydrocarbon gas which is broken down in advance in the total amount of gas is preferably 50% or more, more preferably 90% or more. Further, such a preferable range was found by the inventors based on analysis using gas chromatography. The various conditions required for breaking down the supplied hydrocarbon gas and obtaining the effects of the present invention will be explained specifically below.

(Starting Feedstock Gases)

In the present invention, the ratio of the hydrocarbon gas and silicon feedstock gas is adjusted to give a C/Si ratio of 0.5 to 1.5. These feedstock gases are supplied to the inside of the reaction vessel 1. If these starting feedstock gases are supplied with the stoichiometric ratio C/Si of the carbon (C) and silicon (Si) smaller than this range, as explained above, the C/Si ratio will become smaller the further to the downstream side of the gas flow. Further, if the C/Si becomes larger than this range, the C/Si ratio will become larger the further to the downstream side of the gas flow, so the efficiency of takeup of the nitrogen of the doping gas differs between upstream and downstream in the gas flow. That is, this effect ends up exceeding the effect due to breakdown of the hydrocarbon gas intended (focused on) by the present invention. The doping density when making the SiC epitaxially grow becomes uneven and the effect of the present invention cannot be sufficiently obtained.

As the hydrocarbon gas used in the present invention, for example, methane, ethane, propane, butane, ethylene, acetylene, etc. may be mentioned. One type or two types or more of these hydrocarbons may be used. As explained above, the speed of decomposition of hydrocarbon gas has an effect on the C/Si ratio and the amount of doping greatly increases near the position of supply of the gases, so the effect of the present invention may be considered to be small with regard to methane where decomposition may appear to progress fast at first glance, but as a result of study, it was confirmed that the present invention was effective even with regard to methane. This may be considered to be because, as shown in Table 1, in a hydrocarbon with two or more carbon atoms, the C—C bonds are not that strong and, rather, the cleavage of C—H bonds requires large force energy-wise, so it is effective to assist the cleavage of this part by a catalyst.

TABLE 1

| Bond type | Binding energy (kJ/mol) |
| --- | --- |
| H$_3$C—H | 431 |
| H$_5$C$_2$—H | 410 |
| ≡C—C≡ | 348 |
| =C=C= | 607 |
| —C≡C— | 828 |

As the silicon feedstock gas containing silicon, for example, silane, disilane, trichlorosilane, dichlorosilane, silicon tetrachloride, etc. may be mentioned. One type or two types or more of these may be used. Among these, in the generally used silane, the Si—H bonds are not strong, so it is considered that decomposition proceeds to a certain extent from the start without the aid of a catalyst. Further, regarding disilane, the Si—Si bonds are weak, so the decomposition behavior may be considered similar to that of silane. On the other hand, with a silane-based gas containing chlorine with its etching action, the bonds are relatively strong, but if the decomposition causes the formation of chlorine atoms, due to the radical reaction, the silane-based gas containing other chlorine will break down in a chain reaction, so there is no particular need to use a catalyst.

(Hydrocarbon Decomposition Catalyst)

As the hydrocarbon decomposition catalyst for contacting and breaking down the hydrocarbon gas (below, sometimes simply abbreviated as "catalyst"), for example, ruthenium, rhodium, palladium, platinum, and other such platinum group elements may be used. These platinum group elements are usually used for exhaust gas purification catalysts in a particle form carried in a zeolite or other support, but even with sheet members made of these metal elements, at a high temperature of 1000° C., the results which suggested a rise in the speed of decomposition of the hydrocarbon gas were obtained. Further, it was confirmed that by making the surface area (that is, contact area with gas) of the sheet-shaped metal present in a unit volume larger by making the sheets corrugated etc., the speed of decomposition of the hydrocarbon gas became faster.

Further, it is also possible to use copper as the catalyst for breaking down the hydrocarbon gas. Copper is widely known to break down oxygen molecules (O$_2$) to form oxygen atoms (O), but also has the ability to break down hydrogen molecules (H$_2$) to form hydrogen atoms (H). Therefore, it is possible to consider that the atomic state hydrogen causes the reaction gas to be activated and as a result leads to a rise in the speed of decomposition of the hydrocarbon gas.

As the catalyst for breaking down the hydrocarbon gas, in addition, titanium, zirconium, hafnium, and other Group IVA elements may be used. These Group IVA elements are known as catalysts for breaking down heavy hydrocarbon oil and can effectively contribute to the breakdown of hydrocarbon gas. In the present invention, as the hydrocarbon decomposition catalyst, it is possible to use one catalyst selected from the above such platinum group elements and copper or Group IVA elements or to use two types or more combined. For example, it is possible to prepare a plurality of types of metal sheets respectively consisting of single metal element and combine the metal sheets of the different metal elements to construct a catalyst having a honeycomb structure. Alternatively, it is also possible to use an alloy containing two or more elements selected from among platinum group elements, copper, and Group IVA elements.

The method of making the hydrocarbon gas contact the catalyst is not particularly limited, but, as explained above, from the viewpoint of eliminating the liability of powder entering the epitaxial system, it is preferable to form the contact surface of the catalyst contacting the hydrocarbon by a surface of a metal containing the above metal elements. Therefore, the hydrocarbon decomposition catalyst is preferably formed by a metal. Further, when forming the hydrocarbon decomposition catalyst by metal sheets, the thickness of the metal sheets is preferably 100 μm to 2 mm considering prevention of deformation at a high temperature and securing the specific surface area. The specific surface area when using this range of thickness of sheet corresponds to 5 cm$^{-1}$ to 100 cm$^{-1}$.

Figure 4A:
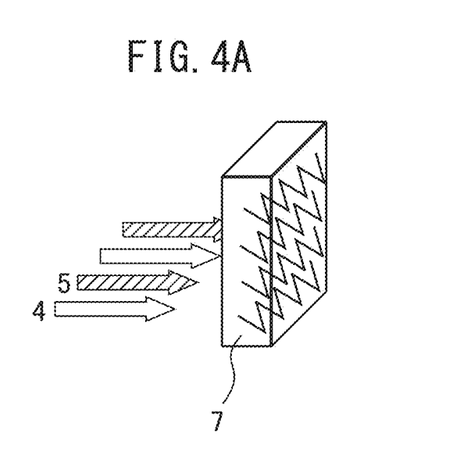
FIG. 4 is a schematic view showing an example of formation of a catalyst tank using sheet-shaped catalysts.
Figure 4B:
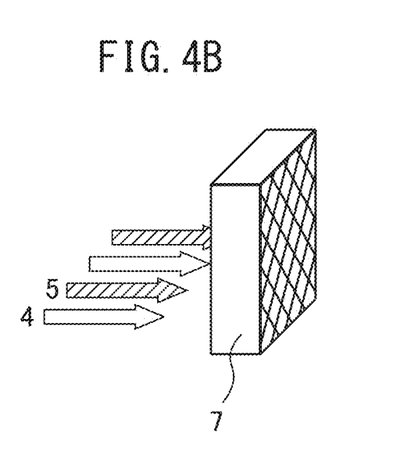

The contact surface of the catalyst may be flat shaped, curved shaped, or a structure allowing the passage of a gas. For example, it is effective to form the contact surface of the sheet-shaped catalyst into a fine concave-convex pattern by giving pearskin finishes to the contact surface or otherwise in order to increase the surface area of the contact surface. Further, it is also effective to make the sheet-shaped catalyst corrugated to increase the contact surface area. Furthermore, as shown in FIG. 4A, it is possible to arrange a plurality of corrugated sheet-shaped catalysts or, as shown in FIG. 4B, form the sheet-shaped catalysts into a honeycomb structure etc. to form the catalyst tank 7 and have the hydrocarbon gas 4 supplied through the tank 7 to the growth chamber. The hydrocarbon decomposition catalyst can be given a specific surface area of 5 to 1000 cm$^{-1}$ by working the surfaces of metal sheets of a thickness of 100 μm to 2 mm or forming metal sheets of that thickness into a 3D structure.

(Contact Conditions of Hydrocarbon Gas and Catalyst)

In the present invention, the hydrocarbon gas should be made to contact the catalyst before the growth chamber inside of the reaction vessel. Preferably, for example, the catalyst is arranged at the gas feed port supplying gases to the growth chamber etc. so as to make the gases contact the catalyst right before entering the growth chamber. Further, the hydrocarbon gas may be mixed with the silicon feedstock gas and introduced into the growth chamber after being made to contact the catalyst or may be made to contact the catalyst and be introduced in the growth chamber in the state of mixed feedstock gases mixed with the silicon feedstock gas in advance.

Further, the pressure of the hydrocarbon gas when passing through the catalyst or the partial pressure of the mixed feedstock gases is preferably 2 kPa to 20 kPa. Further, the range of flow per unit time of the hydrocarbon gas passing through the catalyst is suitably set according to the size of the system used.

As explained above, from the viewpoint of preventing deposition of silicon carbide at the gas feed port, the temperature of the hydrocarbon decomposition catalyst to which the mixed feedstock gases are made to contact is preferably 1000° C. to 1200° C.

(Growth Conditions of SiC Epitaxial Thin Film)

Further, the growth temperature of the SiC thin film, that is, the temperature wherein the carbon-containing gas and the silicon feedstock gas are caused to react, is 1500° C. to less than 1800° C. If growing the SiC thin film over this temperature range, the defects increase, the phenomenon of bunching appears, and otherwise a drop in the quality itself of the epitaxially grown SiC thin film is invited. Therefore, the SiC wafer or SiC substrate is heated so that the SiC wafer becomes 1500° C. to less than 1800° C. Further, in the growth chamber, the carbon-containing gas and silicon feedstock gas may be heated to 1500° C. to less than 1800° C. so as to become the same extent of temperature as the SiC wafer.

Further, the thickness of the SiC thin film made to grow on the SiC substrate is preferably 3 μm to 100 μm. If thinner than 3 μm, the region for building in devices becomes too narrow and it becomes difficult to secure reliability. Conversely, if thicker than 100 μm, warping of the SiC wafer becomes remarkable and peeling becomes easy and there are otherwise possibilities for detrimentally affecting the device process.

Above, the present invention as explained while showing the example of running the feedstock gases in the horizontal direction (from the side) with respect to the SiC substrates carried on the holder so as to grow SiC thin films, but the invention may also be applied to the case such as running the feedstock gases in the vertical direction to the SiC substrates.

EXAMPLES

Below, examples and comparative examples will be used to explain the present invention more specifically. Note that the present invention is not limited to the following content.

Example 1

Figure 3:
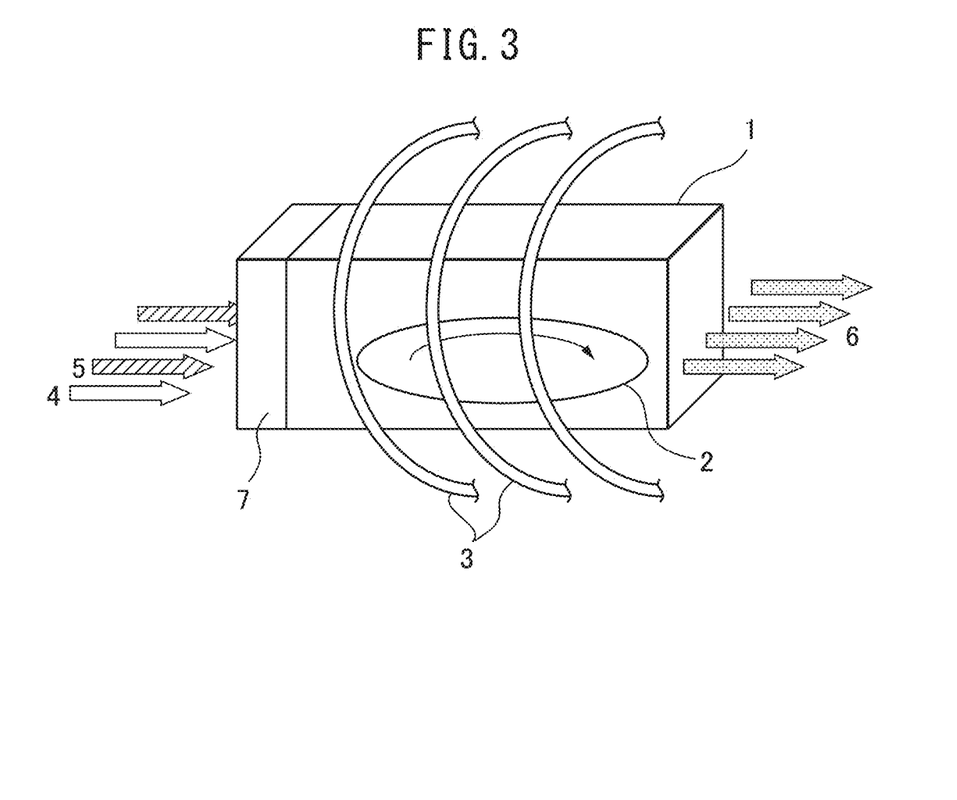
FIG. 3 is a view showing one example of a specific epitaxial system of the present invention.

As shown in FIG. 3, using an epitaxial system having a structure wherein a mixed feedstock gas of the hydrocarbon gas and silicon feedstock gas run through a catalyst tank 7 comprising metal sheets having catalytic actions and are guided to a growth chamber, a test was conducted to confirm the effects of a catalyst in epitaxial growth of SiC. First, four platinum sheets (vertical 400 mm×horizontal 40 mm×thickness 0.5 mm) worked into corrugated shapes were assembled into a catalyst tank 7 as shown in FIG. 4A. This catalyst tank 7 was provided at the gas feed port side of a reaction vessel 1. Propane gas (mixed gas diluted by hydrogen to 30 vol % concentration) was introduced at a rate of 210 cc/min and silane gas (mixed gas diluted by hydrogen to 50 vol % concentration) at 280 cc/min. The mixed feedstock gases consisting of these mixed together were supplied through the catalyst tank 7 held at 1000° C. to epitaxially grow SiC thin films on the six SiC substrates carried on the holder 2 of the growth chamber.

The flow rate of gas becomes, by C/Si ratio, 210×0.3×3/280×0.5=1.35. For the feedstock gases, hydrogen gas was introduced as the carrier (total 134 liter/min). The pressure during growth was 7.3 kPa. The growth temperature was made 1650° C. Further, the system was designed so as to obtain SiC thin films in which the doping density is 3.0× 10$^{15}$ (/cm$^3$). The growth chamber was separately charged with nitrogen gas (mixed gas diluted by hydrogen gas to 10% concentration) at a rate of 100 cc/min. Further, the epitaxial growth was conducted for about 0.5 hour so that the thickness of the obtained SiC thin films became 5 μm.

Here, the SiC substrates on which the SiC thin films are grown have 100 mm sizes. Six of these were arranged, as shown in FIG. 2, on the holder 2 (A to F). The holder 2 was made to rotate in the horizontal direction at about 30 rpm while causing epitaxial growth. After the epitaxial growth, one of the obtained epitaxial SiC wafers (position of A) was measured for film thickness and doping density of the grown SiC thin film at 25 points on the surface. Here, the film thickness was measured by an FT-IR apparatus (made by Nanometrics). Further, the doping density was measured using a CV measurement device (CVmap92A made by Four Dimensions). The results are shown in FIG. 5.

Figure 5A:
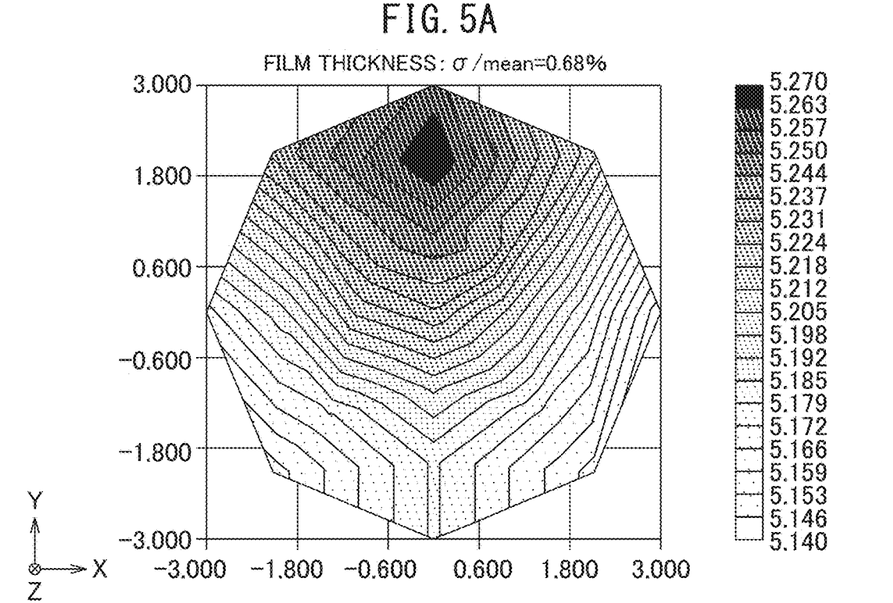
FIG. 5 shows an example of the planar distribution of film thickness and doping density measured at 25 points on the surface of an epitaxial SiC wafer obtained by epitaxial growth according to the present invention.
Figure 5B:
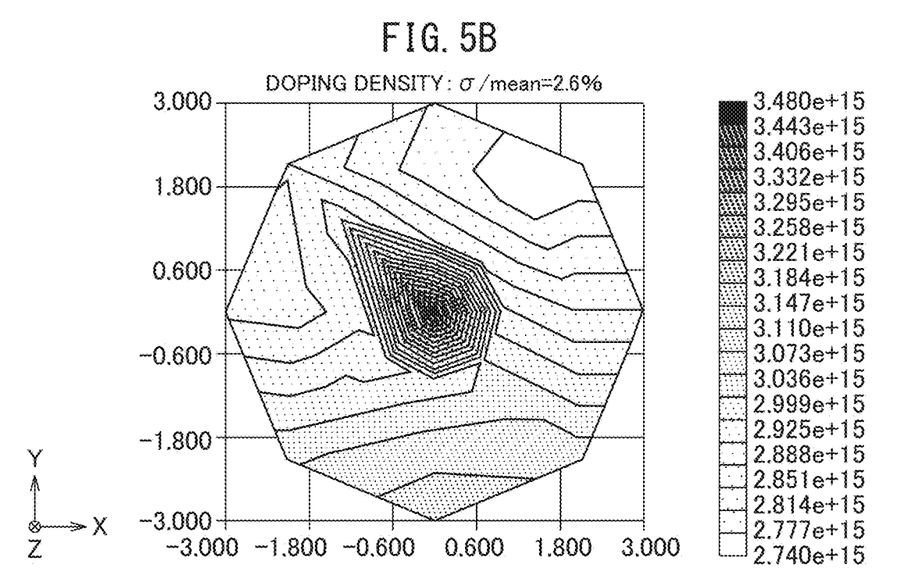

The variation among 25 points on the surface was, for the film thickness, as shown in FIG. 5A, an σ/average value=0.68% and for the doping density, as shown in FIG. 5B, was an σ/average value=2.6%, both good values. The present invention is particularly effective with respect to the doping density. There is no longer a high doping region close to the gas feed position. Therefore, even in the difficult-to-control low doping region, a good in-plane uniformity was confirmed. Further, according to the present invention, it was confirmed that the in-plane uniformity of the film thickness as well was improved.

Examples 2 to 24

Except for changing the types of the metal sheets used as the catalyst and the worked shapes of the metal sheets and the temperature of the catalyst tank, the same procedure was followed as in Example 1 to epitaxially grow SiC thin films. The taken out single epitaxial SiC wafer was evaluated for in-plane uniformity of film thickness (variation in film thickness) and in-plane uniformity of doping density (variation in doping density) in the same way as Example 1. The results are shown together in Table 2. Here, regarding the catalyst shapes, the case of forming a catalyst tank such as in FIG. 4A by working the catalyst sheets into corrugated shapes in the same way as in Example 1 will be denoted as "Corrugated", while the case of forming a catalyst tank such as in FIG. 4B by making the metal sheets of the catalyst form a honeycomb structure will be denoted as "Honeycomb". In these catalyst tanks, the contact area which the mixed feedstock gas contacts is about 640 cm² in the case of the "Corrugated" tank, and the contact area is about 5000 cm² in the case of the "Honeycomb" tank.

Comparative Example 1

No catalyst tank was used, but the other conditions were made the same as Example 1 for epitaxial growth. The taken out epitaxial SiC wafer had an in-plane uniformity of film thickness and an in-plane uniformity of doping density shown in Table 2. If supplying mixed feedstock gases without going through a catalyst tank, the doping density becomes extremely high near the position of supply of the feedstock gases, so even if the holder rotates, the density is not sufficiently leveled out, the doping density becomes higher at the outer circumference of the holder, and the uniformity of doping density in the planar direction greatly deteriorates compared with Examples 1 to 24. Further, the uniformity of film thickness was also observed to deteriorate in the same way.

TABLE 2

| Ex./Comp. ex. | Catalyst metal | Catalyst shape | Catalyst tank temp. (° C.) | Uniformity of thickness (%) | Uniformity of doping (%) |
|---|---|---|---|---|---|
| Ex. 1 | Platinum | Corrugated | 1000 | 0.68 | 2.6 |
| Ex. 2 | Platinum | Corrugated | 1200 | 0.70 | 2.4 |
| Ex. 3 | Platinum | Honeycomb | 1200 | 0.75 | 2.2 |
| Ex. 4 | Ruthenium | Corrugated | 1000 | 0.56 | 3.2 |
| Ex. 5 | Ruthenium | Corrugated | 1200 | 0.60 | 3.0 |
| Ex. 6 | Ruthenium | Honeycomb | 1200 | 0.65 | 2.9 |
| Ex. 7 | Rhodium | Corrugated | 1000 | 0.65 | 2.8 |
| Ex. 8 | Rhodium | Corrugated | 1200 | 0.68 | 2.5 |
| Ex. 9 | Rhodium | Honeycomb | 1200 | 0.70 | 2.4 |
| Ex. 10 | Palladium | Corrugated | 1000 | 0.55 | 3.3 |
| Ex. 11 | Palladium | Corrugated | 1200 | 0.58 | 3.2 |
| Ex. 12 | Palladium | Honeycomb | 1200 | 0.63 | 3.0 |
| Ex. 13 | Copper | Corrugated | 1000 | 0.45 | 3.5 |
| Ex. 14 | Copper | Corrugated | 1200 | 0.45 | 3.3 |
| Ex. 15 | Copper | Honeycomb | 1200 | 0.48 | 3.2 |
| Ex. 16 | Titanium | Corrugated | 1000 | 0.60 | 2.9 |
| Ex. 17 | Titanium | Corrugated | 1200 | 0.61 | 2.8 |
| Ex. 18 | Titanium | Honeycomb | 1200 | 0.62 | 2.7 |
| Ex. 19 | Zirconium | Corrugated | 1000 | 0.70 | 4.0 |
| Ex. 20 | Zirconium | Corrugated | 1200 | 0.70 | 3.8 |
| Ex. 21 | Zirconium | Honeycomb | 1200 | 0.72 | 3.6 |
| Ex. 22 | Halfnium | Corrugated | 1000 | 0.75 | 4.1 |
| Ex. 23 | Halfnium | Corrugated | 1200 | 0.73 | 3.7 |
| Ex. 24 | Halfnium | Honeycomb | 1200 | 0.73 | 3.7 |
| Comp. Ex. 1 | None | — | — | 3.2 | 10 |

Example 25

In the same way as Example 1, using an epitaxial apparatus comprising a catalyst tank provided with corrugated platinum sheets, propane gas (mixed gas diluted by hydrogen to 30% concentration) was supplied at a rate of 187 cc/min and silane gas (mixed gas diluted by hydrogen to 50% concentration) was supplied at a rate of 280 cc/min. These mixed feedstock gases were run through a catalyst tank held at 1000° C. to epitaxially grow SiC thin films on six SiC substrates carried in the holder 2 of the growth chamber.

The flow rate of gas becomes, by C/Si ratio, 187×0.3×3/280×0.5=1.20. For the feedstock gases, hydrogen gas was introduced as the carrier (total 134 liter/min). The pressure during growth was 7.3 kPa. The growth temperature was made 1635° C. Further, the system was designed so as to obtain a SiC thin film in which the doping density is $3.0 \times 10^{15}$ (/cm³). The growth chamber was separately charged with nitrogen gas (mixed gas diluted by hydrogen gas to 10% concentration) at a rate of 90 cc/min. Further, the epitaxial growth was conducted for about 0.5 hour so that the thickness of the obtained SiC thin film became 5 μm. The obtained epitaxial SiC wafers were measured for uniformities of film thickness and doping density in the same way as in Example 1. As a result, the variation in film thickness (uniformity of thickness) was 0.65%, while the variation in doping density (uniformity of doping) was 2.7%.

Examples 26 to 37 and Comparative Examples 2 to 5

As shown in Table 3, except for changing the types of the silicon feedstock gas (Si gas) and hydrocarbon gas (C gas), C/Si ratio, and growth temperature, the same procedure as in Example 25 was followed to epitaxially grow SiC thin films. The taken out epitaxial SiC wafers were measured for an in-plane uniformity of film thickness and an in-plane uniformity of doping density in the same way as Example 1. The results are shown together in Table 3.

TABLE 3

| Ex./Comp. ex. | Si gas | C gas | C/Si ratio | Growth temperature (° C.) | Uniformity of thickness (%) | Uniformity of doping (%) |
|---|---|---|---|---|---|---|
| Ex. 25 | Silane | Propane | 1.2 | 1635 | 0.65 | 2.7 |
| Ex. 26 | Silane | Propane | 0.5 | 1635 | 1.2 | 3.5 |
| Ex. 27 | Silane | Propane | 1.5 | 1635 | 0.90 | 3.0 |
| Ex. 28 | Silane | Propane | 1.2 | 1500 | 0.80 | 2.9 |
| Ex. 29 | Silane | Propane | 1.2 | 1800 | 1.9 | 3.3 |
| Ex. 30 | Silane | Methane | 1.2 | 1635 | 0.73 | 2.6 |
| Ex. 31 | Silane | Butane | 1.2 | 1635 | 0.75 | 2.9 |
| Ex. 32 | Silane | Ethylene | 1.2 | 1635 | 0.80 | 3.1 |
| Ex. 33 | Silane | Acetylene | 1.2 | 1635 | 0.85 | 3.5 |
| Ex. 34 | Disilane | Propane | 1.2 | 1635 | 0.65 | 2.8 |
| Ex. 35 | Trichlorosilane | Propane | 1.2 | 1635 | 0.70 | 3.0 |
| Ex. 36 | Dichlorosilane | Propane | 1.2 | 1635 | 0.71 | 3.3 |
| Ex. 37 | Silicon tetrachloride | Propane | 1.2 | 1635 | 0.75 | 3.5 |
| Comp. Ex. 2 | Silane | Propane | 0.4 | 1635 | 2.2 | 11 |
| Comp. Ex. 3 | Silane | Propane | 1.6 | 1635 | 3.5 | 15 |
| Comp. Ex. 4 | Silane | Propane | 1.2 | 1400 | 2.0 | 10 |
| Comp. Ex. 5 | Silane | Propane | 1.2 | 1900 | 3.3 | 13 |

From the above, it was confirmed that in the production of an epitaxial SiC wafer, according to the present invention, it is possible to suppress variation in the doping density and therefore there is a remarkable effect. Further, it is learned that this is also effective in realizing in-plane uniformity of film thickness.

REFERENCE SIGNS LIST 1. reaction vessel
2. holder
3. induction coil for heating use
4. hydrocarbon gas
5. silicon feedstock gas
6. exhaust gas
7. catalyst tank

The invention claimed is:

1. An epitaxial growth method for silicon carbide making a hydrocarbon gas and silicon feedstock gas react by a thermal chemical vapor deposition (CVD) process to thereby form a silicon carbide thin film on a silicon carbide single crystal substrate, the epitaxial growth method for silicon carbide comprising:
   adjusting a ratio of the hydrocarbon gas and silicon feedstock gas so as to become, by C/Si ratio, in the range of 0.5 to 1.5,
   making the hydrocarbon gas contact a hydrocarbon decomposition catalyst heated to 1000° C. to 1200° C. so as to make at least part of the hydrocarbon gas break down into carbon and hydrogen, and
   making carbon contained in the hydrocarbon gas and silicon contained in the silicon feedstock gas react at 1500° C. to less than 1800° C. in temperature on the silicon carbide single crystal substrate and form a silicon carbide thin film,
   wherein a thickness of the silicon carbide thin film formed on the silicon carbide single crystal substrate is 3 μm to 100 μm, an in-plane uniformity of thickness of the silicon carbide thin film is in a range from 0.45 to 1.9%, and an in-place uniformity of doping density of the silicon carbide thin film is in a range from 2.2 to 4.1%.

2. The epitaxial growth method for silicon carbide according to claim 1, wherein the ratio of the amount of the hydrocarbon gas made to contact the hydrocarbon decomposition catalyst and decompose in the total amount is 50% or more.

3. The epitaxial growth method for silicon carbide according to claim 1, wherein the hydrocarbon decomposition catalyst comprises at least one type of metal selected from ruthenium, rhodium, palladium, platinum, copper, titanium, zirconium, and hafnium or an alloy comprised of at least two types of elements of the group of metal elements.

4. The epitaxial growth method for silicon carbide according to claim 1, wherein the hydrocarbon decomposition catalyst is provided with a sheet shaped contact surface contacting the hydrocarbon gas.

5. The epitaxial growth method for silicon carbide according to claim 1, wherein the hydrocarbon gas is one or more types of gas selected from a group comprising methane, ethane, propane, butane, ethylene, and acetylene.

6. The epitaxial growth method for silicon carbide according to claim 1, wherein the silicon feedstock gas is one or more types of gas selected from a group comprising silane, disilane, trichlorosilane, dichlorosilane, and silicon tetrachloride.

7. The epitaxial growth method for silicon carbide according to claim 1, wherein the hydrocarbon gas is made to contact the hydrocarbon decomposition catalyst in a state of mixed feedstock gases comprising the hydrocarbon gas and the silicon feedstock gas mixed together.

* * * * *